(12) United States Patent
Wirth et al.

(10) Patent No.: US 6,426,640 B1
(45) Date of Patent: Jul. 30, 2002

(54) SEMICONDUCTOR MODULE FOR BURN-IN TEST CONFIGURATION

(75) Inventors: Norbert Wirth, Unterschleissheim; Eric Cordes; Zoltan Manyoki, both of Müchen; Dominique Savignac, Ismaning, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/440,803

(22) Filed: Nov. 15, 1999

(30) Foreign Application Priority Data

Nov. 13, 1998 (DE) .......................................... 198 52 429

(51) Int. Cl.[7] .............................................. G01R 31/02
(52) U.S. Cl. ...................................... 324/760; 324/763
(58) Field of Search ................................ 324/760, 500, 324/537, 765, 763; 327/290

(56) References Cited

U.S. PATENT DOCUMENTS

| 4,150,354 A | * | 4/1979 | Namitokov et al. | ........ 337/290 |
| 5,909,142 A | * | 6/1999 | Kawasaki et al. | .......... 327/543 |

* cited by examiner

*Primary Examiner*—Safet Metjahic
*Assistant Examiner*—Paresh Patel
(74) *Attorney, Agent, or Firm*—Laurence A. Greenberg; Werner H. Stemer; Ralph E. Locher

(57) ABSTRACT

The invention relates to a semiconductor module for a burn-in test configuration. The semiconductor module has a regulator which, when it is turned on, always supplies a constant low voltage to an internal circuit of the semiconductor module. The semiconductor module also contains a component which, when the burn-in voltage has been applied for a defined time period, supplies a different characteristic than when the internal voltage is applied.

8 Claims, 2 Drawing Sheets

SEMICONDUCTOR MODULE FOR BURN-IN TEST CONFIGURATION

BACKGROUND OF THE INVENTION

Field of the Invention

The invention lies in the semiconductor technology field. More specifically, the invention relates to a semiconductor module for a burn-in test configuration in which the semiconductor module can have a burn-in voltage applied to it which is higher than an internal voltage of the semiconductor module. The internal voltage can thereby be impressed on an internal circuit of the semiconductor module when an external voltage is applied to the semiconductor module via a regulator which is contained in the semiconductor module and can be turned on and off. The semiconductor module is subjected to an aging process by applying the burn-in voltage during a burn-in time period when the regulator is turned off.

A failure rate R of semiconductor modules as a function of a time T may be represented in a bath tub-shaped curve: when a large number of inherently identical semiconductor modules have been manufactured, a large proportion of the semiconductor modules fails up to a particular time T, so that the failure rate R is relatively high. After that time T has been reached, the failure rate R remains at a low value until, after the semiconductor modules have been used for a relatively long time, they start to fail increasingly again after an instant T'.

The curve representing the failure rate R as a function of the time t is shown schematically in FIG. 3.

Hence, in order to prevent semiconductor modules which have just been manufactured from failing with the user after a relatively short time, that is to say before the time T is reached, the manufacturer subjects the semiconductor modules to a burn-in test in which they are artificially aged, so that their "age" is beyond time T after this burn-in test. The burn-in test is therefore intended to sort out those semiconductor modules which fail after only a short time, so that the user obtains only semiconductor modules which are aged beyond time T.

However, numerous semiconductor modules have a so-called regulator. The regulator converts a voltage, for example 3.3 V, which is applied to the semiconductor module externally, into an internal voltage in each case. The internal voltage has a constant value and can be 2.5 V, for example, for an external voltage of approximately 3.3 V.

To age a semiconductor module artificially, a higher voltage of, for example, 4.3 V is applied to it in the burn-in test. The higher voltage causes the semiconductor module to age artificially relatively quickly, so that the time T is reached by the aging process after just a short actual time has elapsed. However, such artificial aging occurs only when the regulator is turned off, that is to say it is in the regulator-off test mode.

However, it has now been found that, during burn-in tests in so-called dynamic burn-in test configurations, in which alternating burn-in voltages are applied to the semiconductor module, the semiconductor modules do not go into the regulator-off test mode reliably and correctly. This is due, for example, to contact problems in the receptacles of the semiconductor modules, faulty software, or the like. In this case, there is then no controlled pre-aging as a result of the overvoltage of, for example, 4.3 V being applied. Instead, when the regulator is turned on, the semiconductor module has only 2.5 V applied to it internally, which ages it only slightly, so that the time T is not reached in the burn-in test. In the worst case, the semiconductor module may even not be operated at all, but instead may experience only "hot" storage.

Those semiconductor modules which have not undergone any burn-in test behave entirely inconspicuously during further final tests before delivery to the user. They can, however, drastically increase the failure rate for the user, so that the so-called dpm specifications, that is to say the number of semiconductor modules failing per million semiconductor modules, are drastically increased.

This problem of high failure rates for the user owing to semiconductor modules which have not had the burn-in voltage applied on account of a regulator being turned on was previously virtually impossible to solve, or could be solved only with a large amount of effort involving additional examinations of the semiconductor modules.

This is because, in nontesting burn-in arrangements, there are no reliable mechanisms which could be used to track down semiconductor modules which have not had a relatively high voltage applied to them on account of their regulator being turned on.

In a prior art indirect method, the current required by, for example, 192 or 256 semiconductor modules connected in parallel is measured. If, for example, the current requirement does not rise sharply, then this can be assessed as an alarm signal for a large quantity of semiconductor modules not being in the regulator-off test mode, that is to say having a regulator which is turned on. However, this method only provides a result if approximately 30% of the semiconductor modules are not in the regulator-off test mode, which is an unacceptable value in practice, since the failure rates are significantly lower. This method also does not allow the faulty or critical semiconductor modules to be identified.

SUMMARY OF THE INVENTION

It is accordingly an object of the invention to provide a semiconductor module for a burn-in test configuration, which overcomes the above-mentioned disadvantages of the heretofore-known devices and methods of this general type and which renders it an easy matter to establish whether or not the semiconductor module was in the regulator-off test mode during the burn-in test.

With the foregoing and other objects in view there is provided, in accordance with the invention, a semiconductor module for a burn-in test configuration, comprising:

an internal circuit in the semiconductor module;

a regulator connected to the internal circuit for impressing an internal voltage on the internal circuit when an external voltage is applied via the regulator and the regulator is turned on;

wherein the semiconductor module is to be subjected to an aging process by applying a burn-in voltage higher than the internal voltage during a burn-in time period while the regulator is turned off; and a component integrated in the semiconductor module which, when the burn-in voltage is applied after an end of the burn-in time period, has a different characteristic when the regulator is turned off than when the regulator is turned on.

In accordance with an added feature of the invention, the characteristic of the component is a degradation of the component.

In accordance with an additional feature of the invention, the component is connected to the internal voltage when the regulator is turned off.

In other words, the invention satisfies the above-noted objects with a semiconductor module of the type mentioned in the introduction in that the semiconductor module contains an integral component which, when the burn-in voltage is applied after the end of the burn-in time period, has an indicator characteristic which indicates whether the regulator was turned off or turned on. The characteristic used in this case can be a degradation or deterioration of the component.

The semiconductor module thus contains an integral semiconductor component which, when the regulator-off test mode is turned on, that is to say when the regulator is turned off, is connected to the internal voltage present in the semiconductor module. For this, the semiconductor component is dimensioned such that, when the burn-in voltage is applied, which, as also indicated in the above example, is approximately twice as high as the internal voltage when the regulator is turned on, the semiconductor component becomes degraded within the burn-in time period. This degradation can comprise a change in a voltage, a current or a resistance value in the semiconductor component, for example.

In a subsequent final test for the semiconductor modules, the characteristic can be assessed, so that, depending on the results of this assessment, appropriate signals are produced at a data output of the semiconductor module. In the case of semiconductor modules which have not been subjected to correct burn-in, the component is not degraded, which results in a corresponding data item at the data output in the final test. Semiconductor modules traced in this manner can then be sorted out for a new burn-in test or be sent to the user as second-class semiconductor modules.

In accordance with another feature of the invention, the component is a fuse.

In accordance with a preferred feature of the invention, an output signal reporting that the fuse has burnt is produced only when the regulator is turned off.

In accordance with an alternative feature of the invention, the component includes a plurality of fuses which can burn during the burn-in test when the regulator is turned off.

Instead of an electrically degradable component, therefore, it is also possible to use one or more electrical fuses which are severed by applying a voltage. Burnout of the fuses is initiated by a burn-in test program using a special test mode. However, the semiconductor module carries out this burnout or fusing only if it is in the regulator-off state. In this regard, for example, a signal reporting the regulator-off state of the semiconductor component can be fed, together with a command signal for burning a fuse, to an AND gate: the AND gate only supplies an output signal if the fuse is severed and the regulator-off state is actually present.

By using a plurality of fuses, various burn-in steps can be represented and the curve of the burn-in with respect to time can be documented.

By reading out the fuses in the final test, a decision can then be made about a positive burn-in curve. In the semiconductor module according to the invention, it is very important that the information about successful/unsuccessful burn-in is available in the semiconductor module itself. Irrespective of individual burn-in arrangements and possible mix-ups, etc., it is a very quick matter to check in the final test whether or not a semiconductor module was in the regulator-off state for a certain minimum time period when an overvoltage was applied.

In accordance with a further feature of the invention, the component is adapted to be ruptured by electromigration.

In accordance with a concomitant feature of the invention, the component is a meander-shaped aluminum strip.

It is true of the electrically degradable component that, in operation at a normal, regulated internal voltage of, for example, 2.5 V and using a maximum burn-in time period of approximately 15 hours, the electrically degradable component reliably "survives" and is not destroyed. During operation at the overvoltage of the aforementioned 4.3 V, however, the component is certainly degraded within the burn-in time period beyond a certain limit value, which may be the case after a target time period of 2 hours has elapsed, for example. The degraded state of the component should be easy to distinguish from the nondegraded state. This is possible, for example, with a component having a structure which ruptures as a result of electromigration. Such a component can comprise a meander-shaped aluminum strip which has a low width and is situated between a supply voltage and an operating voltage of the semiconductor module. In such a structure, the currents required can be kept low. A current having a sufficient current density flows from the low-width aluminum strip to another part of the component, which is dimensioned to be wide and short. Since the voltage is stipulated, the desired current level for electromigration is produced by a correspondingly low resistance of the component.

Other features which are considered as characteristic for the invention are set forth in the appended claims.

Although the invention is illustrated and described herein as embodied in provide a semiconductor module for a burn-in test configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
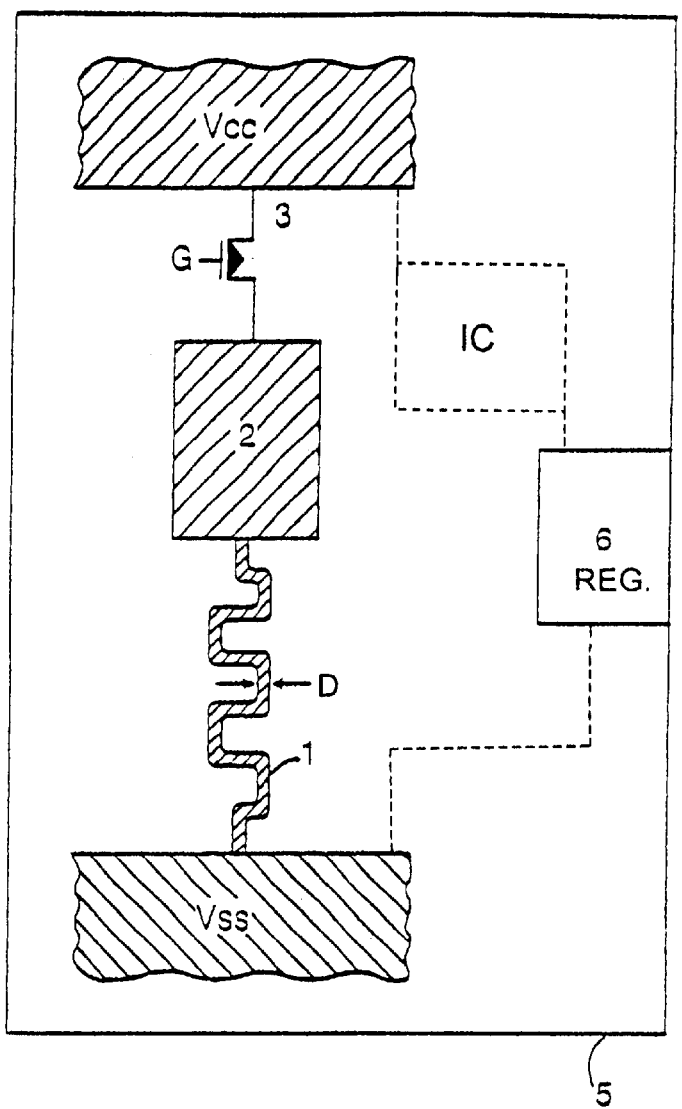
FIG. 1 is a diagrammatic view of an exemplary embodiment of the component in the semiconductor module according to the invention.

Referring now to the figures of the drawing in detail and first, particularly, to FIG. 1 thereof, there is seen a thin (low-thickness) aluminum strip 1 routed between ground Vs and a patch 2 which is likewise made of aluminum. The patch 2 is connected to the supply voltage Vcc via a p-channel field effect transistor 3 with a large width. The aluminum strip 1 and the aluminum patch 2 are of open design and are produced without a protective layer. The field effect transistor 3 is turned on at its gate G when a burn-in test is carried out. The width D of the aluminum strip 1 is a few $\mu$m, for example. An internal circuit of the semiconductor component 5 is schematically indicated at the box IC.

Electromigration causes the aluminum strip 1 to rupture after 2 hours, for example, at an applied burn-in voltage of 4.3 V. In contrast, the aluminum strip 1 can withstand a voltage of approximately 2.5 V, that is to say the internal voltage when the regulator is turned on, for virtually any desired length of time. In other words, the degradation of the aluminum strip 1 can reliably be used to ascertain whether the burn-in voltage has been applied to a semiconductor module 5 which contains the integral component shown in FIG. 1 or whether the semiconductor module 5 has only had the internal voltage applied to it as a result of a regulator 6 being turned on.

Figure 2:
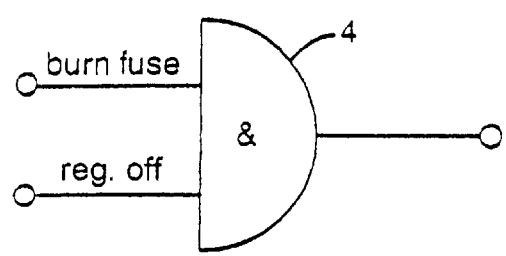
FIG. 2 is a schematic view of an AND function for a burn-fuse command signal with a regulator-off signal.

FIG. 2 shows another illustrative embodiment, combining a regulator-off signal "reg. off" with a command signal to burn a fuse "burn fuse" through an AND gate 4: only if both signals "reg. Off" and "burn fuse" are applied to the inputs of the AND gate 4, that is to say if the regulator is actually turned off and a fuse reporting this has been burned, does the AND gate 4 provide an output signal indicating that the regulator is turned off at a particular instant, namely when the fuse is severed, and a corresponding fuse has been severed. If a plurality of such AND gates having corresponding fuses are provided, the burn-in period can be documented by severing corresponding fuses in sequence over time.

Figure 3:
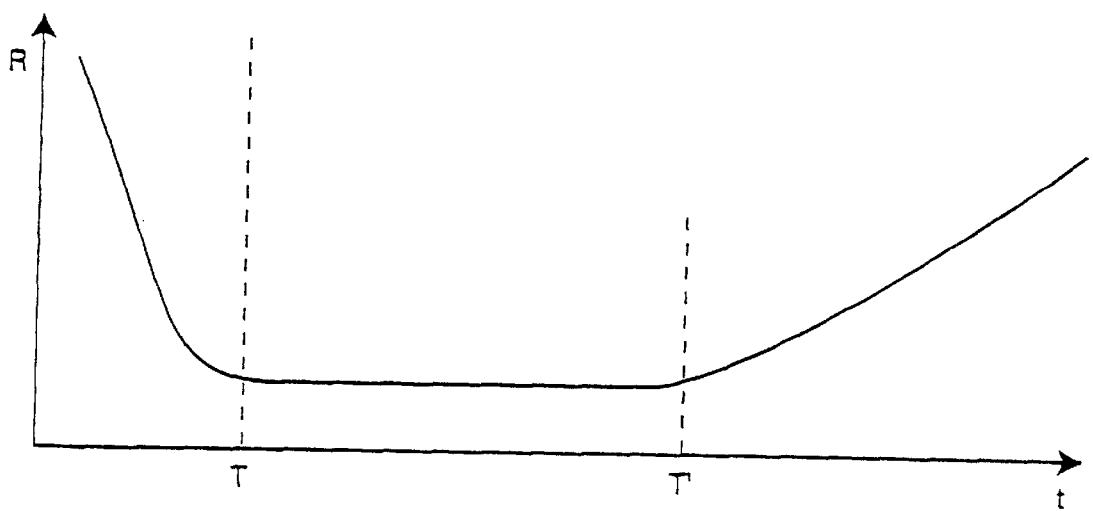
FIG. 3 is a curve of the failure rate R graphed as a function of time t.

Reference is had to the introductory text for a detailed description of FIG. 3.

We claim:

1. A semiconductor module for a burn-in test configuration, comprising:

an internal circuit in the semiconductor module;

a regulator connected to said internal circuit for impressing an internal voltage on said internal circuit when an external voltage is applied via said regulator and said regulator is turned on;

wherein the semiconductor module is to be subjected to an aging process by applying a burn-in voltage higher than the internal voltage during a burn-in time period while said regulator is turned off; and a component integrated in the semiconductor module which, when the burn-in voltage is applied, has a different characteristic after an end of said burn-in time period when said regulator was turned off than when said regulator was turned on, thereby unambiguously establishing whether or not said regulator was turned off.

2. The semiconductor module according to claim 1, wherein the characteristic of said component is a degradation of said component.

3. The semiconductor module according to claim 1, wherein said component is connected to the internal voltage when said regulator is turned off.

4. The semiconductor module according to claim 1, wherein said component is a fuse.

5. The semiconductor module according to claim 4, wherein an output signal indicating that the fuse has burnt is produced only when the regulator is turned off.

6. The semiconductor module according to claim 4, wherein said component includes a plurality of fuses which can burn during the burn-in test when said regulator is turned off.

7. The semiconductor module according to claim 1, wherein said component is adapted to be ruptured by electromigration.

8. The semiconductor module according to claim 7, wherein said component is a meander-shaped aluminum strip.

* * * * *